(12) United States Patent
Choi

(10) Patent No.: US 9,530,854 B2
(45) Date of Patent: Dec. 27, 2016

(54) ORGANIC LIGHT EMITTING DISPLAY APPARATUS AND METHOD OF MANUFACTURING THE SAME

(71) Applicant: SAMSUNG DISPLAY CO., LTD., Yongin, Gyeonggi-Do (KR)

(72) Inventor: Chaun-Gi Choi, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 14/539,048

(22) Filed: Nov. 12, 2014

(65) Prior Publication Data

US 2015/0236079 A1   Aug. 20, 2015

(30) Foreign Application Priority Data

Feb. 19, 2014   (KR) ........................ 10-2014-0019212

(51) Int. Cl.
| | |
|---|---|
| H01L 27/12 | (2006.01) |
| H01L 29/49 | (2006.01) |
| H01L 27/32 | (2006.01) |
| H01L 29/786 | (2006.01) |
| H01L 29/66 | (2006.01) |
| H01L 29/45 | (2006.01) |
| H01L 29/24 | (2006.01) |
| H01L 51/05 | (2006.01) |

(52) U.S. Cl.
CPC ....... *H01L 29/4916* (2013.01); *H01L 27/3262* (2013.01); *H01L 29/24* (2013.01); *H01L 29/45* (2013.01); *H01L 29/4908* (2013.01); *H01L 29/66969* (2013.01); *H01L 29/7869* (2013.01); *H01L 51/0541* (2013.01); *H01L 51/0545* (2013.01); *H01L 27/3265* (2013.01)

(58) Field of Classification Search
CPC ............. H01L 27/1225; H01L 27/1251; H01L 27/1255
See application file for complete search history.

(56) References Cited

U.S. PATENT DOCUMENTS

| | | | |
|---|---|---|---|
| 7,846,787 B2 | 12/2010 | Cho et al. | |
| 8,030,146 B2 | 10/2011 | Lin et al. | |
| 8,134,152 B2 | 3/2012 | Choi et al. | |
| 8,299,471 B2 | 10/2012 | Liu et al. | |
| 8,421,090 B2 | 4/2013 | Choi | |
| 8,455,876 B2 | 6/2013 | Choi et al. | |
| 2010/0182223 A1 | 7/2010 | Choi et al. | |
| 2011/0215335 A1 | 9/2011 | Kwon et al. | |
| 2015/0236079 A1* | 8/2015 | Choi | ......... H01L 27/3262 257/40 |

FOREIGN PATENT DOCUMENTS

| | | |
|---|---|---|
| KR | 10-1065407 | 9/2011 |
| KR | 10-1100999 | 12/2011 |
| KR | 10-2013-0015251 A | 2/2013 |

* cited by examiner

*Primary Examiner* — Mark Prenty
(74) *Attorney, Agent, or Firm* — Lee & Morse, P.C.

(57) ABSTRACT

An organic light emitting display includes a pixel circuit to supply current to an organic light emitting device. The pixel circuit includes a switching transistor and a driving transistor. The switching transistor includes a first insulating layer between a first gate electrode and an oxide semiconductor layer. The driving transistor includes a second gate electrode on an active layer. The first insulating layer is between the active layer and the second gate electrode.

9 Claims, 7 Drawing Sheets

ORGANIC LIGHT EMITTING DISPLAY APPARATUS AND METHOD OF MANUFACTURING THE SAME

CROSS-REFERENCE TO RELATED APPLICATION

Korean Patent Application No. 10-2014-0019212, filed on Feb. 19, 2014, and entitled, "Organic Light Emitting Display Apparatus and Method of Manufacturing the Same," is incorporated by reference herein in its entirety.

BACKGROUND

1. Field

One or more embodiments herein relate to an organic light emitting display apparatus and a method of manufacturing an organic light emitting display apparatus.

2. Description of the Related Art

An organic light emitting display generates light using organic light emitting devices (OLEDs). Each OLED includes an organic emission layer between a hole injection electrode and an electron injection electrode. In operation, holes from the hole injection electrode and electrons from the electron injection electrode combine in the organic emission layer to form excitons. When the excitons transition from an excited state to a ground state, light is generated to form an image.

Because an organic light emitting display is self-emissive (e.g., does not need a backlight source), it may be driven at a low voltage and may also be thin and light. Also, such a display has a wide viewing angle, high contrast, and fast response speed.

SUMMARY

In accordance with one embodiment, an organic light emitting display which includes a substrate; an organic light emitting device on the substrate; and a pixel circuit to supply current to the organic light emitting device, wherein the pixel circuit includes a switching transistor and a driving transistor on the substrate, the switching transistor including a first insulating layer between a first gate electrode and an oxide semiconductor layer, the driving transistor including a second gate electrode on an active layer, the first insulating layer between the active layer and the second gate electrode.

The oxide semiconductor layer may include one or more selected from the group consisting of gallium, indium, zinc, hafnium, and tin, and oxygen. The first gate electrode may include a polycrystalline silicon layer doped with impurities. The active layer may include a source region and a drain region on respective sides of a channel region, the source and drain regions doped with impurities.

The display may include a second insulating layer on the oxide semiconductor layer and the second gate electrode, wherein the switching transistor may include a first source electrode and a first drain electrode that connect to the oxide semiconductor layer through the second insulating layer.

The driving transistor may include a second source electrode and a second drain electrode respectively connected to the source region and the drain region through the first insulating layer and the second insulating layer.

The pixel circuit may include a capacitor including a first electrode on the substrate and a second electrode on the first electrode, wherein the first insulating layer is between the first electrode and the second electrode. The first electrode may include the polycrystalline silicon layer doped with the impurities, and the second electrode includes the oxide semiconductor layer. The capacitor may include a third electrode on the second electrode, wherein the second insulating layer is between the second electrode and the third electrode. The organic light emitting device may include an organic emission layer between an anode electrode and a cathode electrode.

In accordance with another embodiment, a method of manufacturing an organic light emitting display apparatus includes patterning a polycrystalline silicon layer on a substrate to form an intermediate layer of a first gate electrode and an intermediate layer of an active layer; forming a first insulating layer on the intermediate layer of the first gate electrode and the intermediate layer of the active layer; forming a second gate electrode on the first insulating layer above the intermediate layer of the active layer; doping the intermediate layer of the first gate electrode and the intermediate layer of the active layer with impurities; forming an oxide semiconductor layer on the first insulating layer, so that the oxide semiconductor layer is located on the first gate electrode; forming a second insulating layer on the second gate electrode and the oxide semiconductor layer; and forming a first source electrode and a first drain electrode to connect to the oxide semiconductor layer through the second insulating layer.

The active layer includes a channel region overlapping the second gate electrode, and a source region and a drain region at respective sides of the channel region, the source region and drain region including impurities.

The method may include forming a second source electrode and a second drain electrode to respectively connect to the source region and the drain region through the first insulating layer and the second insulating layer. The first gate electrode may be a gate electrode of a switching transistor, and the second gate electrode may be a gate electrode of a driving transistor. The oxide semiconductor layer may include one or more selected from the group consisting of gallium, indium, zinc, hafnium, and tin, and oxygen.

The method may include applying an amorphous silicon layer on the substrate and crystallizing the amorphous silicon layer to form the polycrystalline silicon layer. The impurities may be P-type impurities.

The method may include forming the intermediate layer of the first gate electrode and the intermediate layer of the active layer by forming an intermediate layer of a first electrode, and wherein: doping the impurities including doping the intermediate layer of the first electrode with the impurities to form the first electrode of the capacitor.

The operation of forming the oxide semiconductor layer may include forming a second electrode of the capacitor to overlap the first electrode. The method may include forming a third electrode of the capacitor on the second insulating layer to overlap the second electrode.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
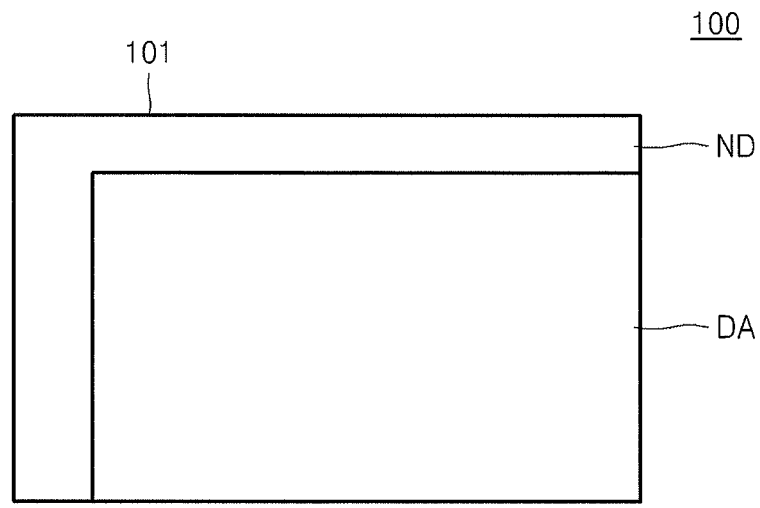
FIG. 1 illustrates an embodiment of an organic light emitting display.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
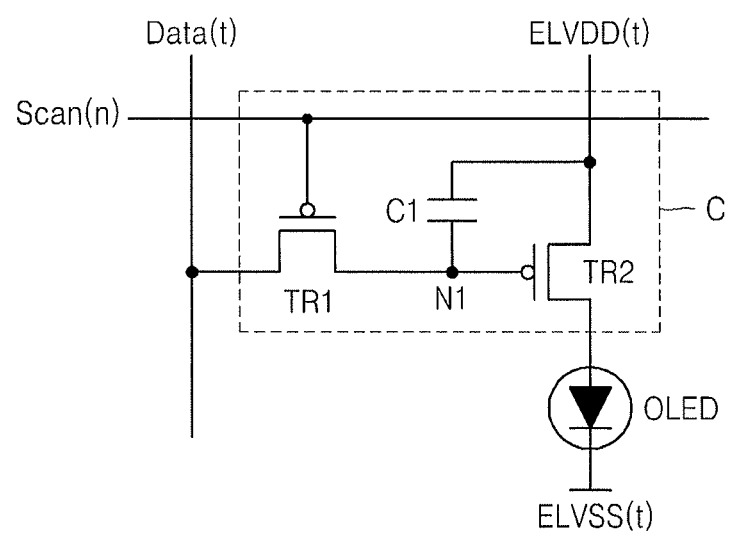
FIG. 2 illustrates an embodiment of a pixel circuit.
Figure 3:
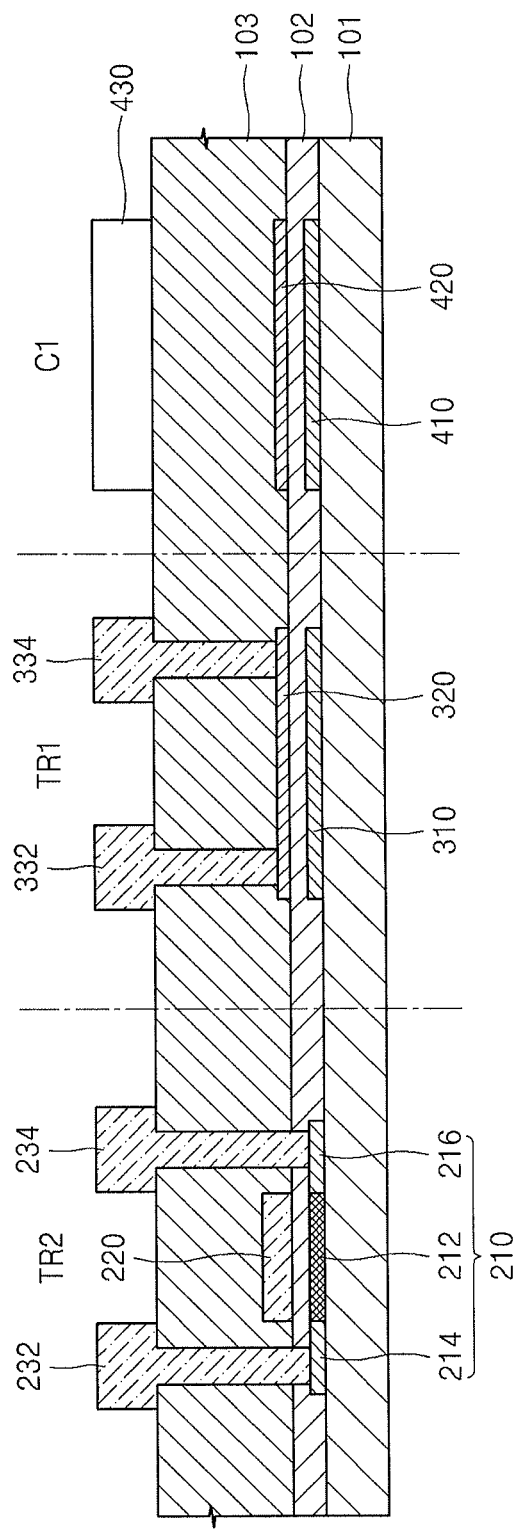
FIG. 3 illustrates examples of transistors and capacitors in the pixel circuit.

FIG. 1 illustrates an embodiment of organic light emitting display 100, FIG. 2 illustrates an embodiment of a pixel circuit, and FIG. 3 illustrates an example of a structure of the pixel circuit which includes thin film transistors (TFTs) and capacitors.

Referring to FIGS. 1 through 3, the organic light emitting display 100 includes a pixel circuit C to supply current to an OLED on a substrate 101. The substrate 101 may include, for example, a transparent glass material (e.g, $SiO_2$), ceramic, plastic, and/or stainless steel. A buffer layer formed, for example, of $SiO_2$ and/or SiNx, may be on the substrate 101 to provide flatness and to prevent impurity elements from infiltrating into the substrate 101.

The substrate 101 includes a display area DA and a non-display area ND. The display area DA includes a plurality of pixels including OLEDs which emit light for generating images. The non-display area ND may include a pad unit to transfer electric signals from a power supply device or a signal generating device to the display area DA.

Each of the pixels includes pixel circuit C for supplying current to the OLED. The OLED includes an anode electrode that serves as a hole injection electrode, a cathode electrode that serves as an electron injection electrode, and an organic emission layer between the anode electrode and the cathode electrode. The anode electrode is connected to the pixel circuit C, and the cathode electrode is connected to a second power source ELVSS(t). The OLED generates light of a predetermined luminance based on the current from the pixel circuit C.

The pixel circuit C includes at least a first transistor TR1, a second transistor TR2, and a capacitor C1. The first transistor TR1 includes a first gate electrode 310 on the substrate 101, an oxide semiconductor layer 320 on the first gate electrode 310, and a first insulating layer 102 between the first gate electrode 310 and the oxide semiconductor layer 320. A first source electrode 332 and a first drain electrode 334 is connected to the oxide semiconductor layer 320. The first source electrode 332 and the first drain electrode 334 is connected to the oxide semiconductor layer 320, while penetrating through a second insulating layer 103 on the oxide semiconductor layer 320.

The first gate electrode 310 may be or include, for example, a polycrystalline silicon layer doped with impurities, e.g., P-type impurities such as boron (B). In another embodiment, the impurities may be N-type impurities such as phosphorus (P).

The oxide semiconductor layer 320 may not be doped with the impurities, and may include, for example, gallium (Ga), indium (In), zinc (Zn), and tin (Sn), oxygen (O), or a combination thereof.

The first gate electrode 310 of the first transistor TR1 is connected to a scan line. The first source electrode 332 is connected to a data line. The first drain electrode 334 is connected to a first node N1. A scan signal Scan(n) is input to the first gate electrode 310 and a data signal Data(t) is input to the first source electrode 332. The first transistor TR1, therefore, serves as a switching transistor for transmitting a data signal.

The first transistor TR1 transmits a data voltage to a capacitor C1, which stores a received data voltage. The first transistor TR1 uses the oxide semiconductor layer 320 as an active layer. As a result, leakage current from the first transistor TR1 may be reduced less than a case where a polycrystalline silicon layer is used as an active layer. Therefore, a reduction in voltage stored in the capacitor C1 may be reduced, and a capacitor C1 may have a small size.

The second transistor TR2 may include an active layer 210 on the substrate 101 and a second gate electrode 220 on the active layer 21. The first insulating layer 102 is between the active layer 210 and the second gate electrode 220. A second source electrode 232 and a second drain electrode 234 is connected to the active layer 210. The second source electrode 232 and the second drain electrode 234 may be connected to the active layer 210 while penetrating through the second insulating layer 103 on the first insulating layer 102 and the second gate electrode 220.

The active layer 210 may be or include, for example, a polycrystalline silicon layer which includes a channel region 212 that is not doped with impurities at a predetermined (e.g., center) region. A source region 214 and a drain region 216 are located at opposite sides of the channel region 212 and are doped with impurities.

The second source electrode 232 and the second drain electrode 234 are respectively connected to the source region 214 and the drain region 216. The impurities may be the same as or different from the impurities doped on the first gate electrode 310.

The gate electrode 220 of the second transistor TR2 is connected to the first node N1. The second source electrode 232 is connected to the first power ELVDD(t). The second electrode 234 is connected to the pixel electrode of the OLED. The second transistor TR2, therefore, serves as a driving transistor for driving the OLED according to a data signal. For example, the second transistor TR2 may supply an output current that is in proportional to a square value of a difference between the voltage stored in the capacitor C1 and a threshold voltage to the OLED.

Especially in the case where the active layer 210 of the second transistor TR2 includes the polycrystalline silicon layer, the active layer 210 may have excellent electron mobility. Therefore, the second transistor TR2 may have a small size.

The capacitor C1 includes a first electrode 410 on the substrate 101 and a second electrode 420 on the first electrode 410. The first insulating layer 102 is between the first electrode 410 and the second electrode 420. The capacitor C1 also includes a third electrode 430 on the second electrode 420. The second insulating layer 103 is between the second electrode 420 and the third electrode 430. Therefore, the first and second insulating layers 102 and 103 may serve as dielectric layers of the capacitor C1.

The first electrode 410 may include a material which is the same as or different from that of the first gate electrode 310, e.g., polycrystalline silicon layer doped with impurities. The second electrode 420 may include a material which is the same as or different from that of the oxide semiconductor layer 320.

The third electrode 430 may include a material which is the same as or different from those of the first source electrode 332, the first drain electrode 334, the second source electrode 232, and/or the second drain electrode 234.

The capacitor C1 may be formed by connecting two capacitors between the first electrode 140 and the second electrode 420 and between the second electrode 420 and the third electrode 430 in parallel to increase density. Thus, the size of the capacitor C1 may be reduced. The capacitor C1 is connected between the first node N1 and the first electrode of the second transistor TR2, e.g., the first power ELVDD(t). The capacitor C1 stores a voltage corresponding to a difference between the voltage transferred from the first transistor TR1 and the voltage supplied from the first power ELVDD(t).

In FIGS. 2 and 3, the pixel circuit includes two transistors TR1 and TR2 and one capacitor C1. In other embodiments, the pixel circuit may include three or more TFTs and two or more capacitors, and/or may include additional wirings as needed to form various structures.

FIGS. 4 to 8 are cross-sectional views illustrating an embodiment of a method for manufacturing a pixel circuit including the TFTs and the capacitor in FIG. 3.

Figure 4:
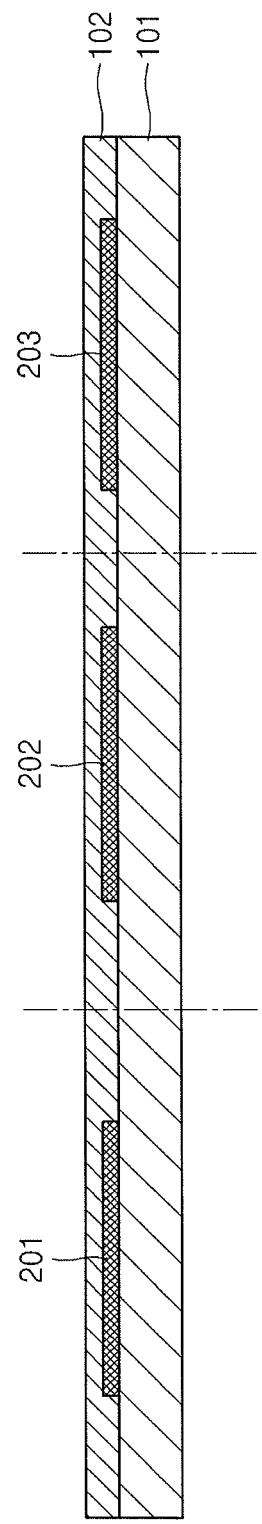
FIGS. 4 to 8 illustrate an embodiment of a method for manufacturing transistors and capacitors in a pixel circuit.

Referring to FIG. 4, the method includes forming a polycrystalline silicon layer on the substrate 101, and patterning the polycrystalline silicon layer to form an intermediate layer 202 of the first gate electrode and an intermediate layer 201 of the active layer. Subsequently, the first insulating layer 102 is formed on the intermediate layer 202 of the first gate electrode and the intermediate layer 201 of the active layer. Additionally, when patterning the polycrystalline silicon layer, an intermediate layer 203 of the first electrode of the capacitor may be formed.

Before forming the polycrystalline silicon layer, a buffer layer may be formed on the substrate 101. The buffer layer may include, for example, $SiO_2$ and/or $SiN_x$, and may be formed by using various deposition methods such as but not limited to a plasma enhanced chemical vapor deposition (PECVD) method, an atmospheric pressure CVD (APCVD) method, and a low pressure CVD (LPCVD) method.

The polycrystalline silicon layer may be formed by crystallizing, for example, amorphous silicon. The amorphous silicon may be crystallized using, for example, a rapid thermal annealing (RTA) method, a solid phase crystallization (SPC) method, an excimer laser annealing (ELA) method, a metal induced crystallization (MIC) method, a metal induced lateral crystallization (MILC) method, and/or a sequential lateral solidification (SLS) method.

The first insulating layer 102 may include a single layer or multiple layers of $SiO_2$ or $SiN_x$, and may be formed using a PECVD method, an APCVD method, or an LPCVD method.

Figure 5:
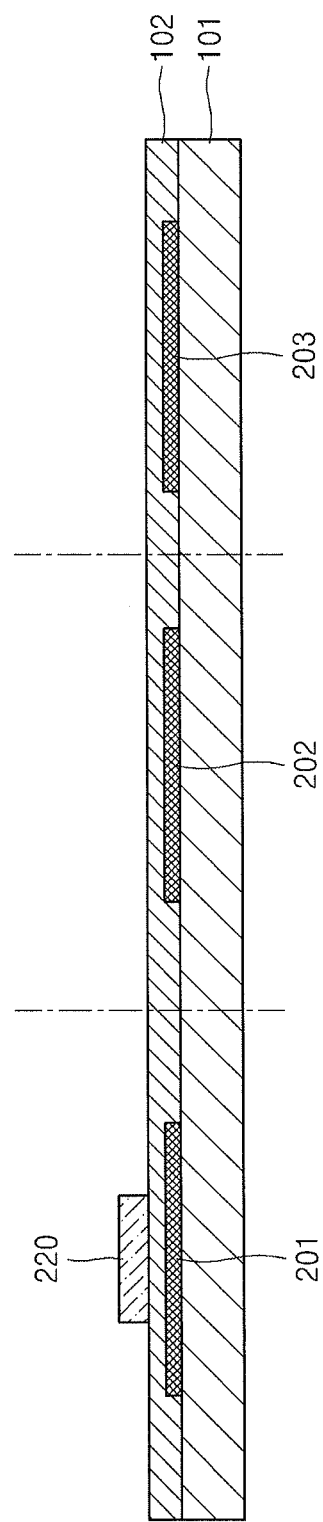

Referring to FIG. 5, the second gate electrode 220 is formed on the first insulating layer 102 so as to be located on the intermediate layer 201 of the active layer. The gate electrode 220 may include, for example, Au, Ag, Cu, Ni, Pt, Pd, Al, and/or Mo, or an alloy such as Al:Nd alloy, and Mo:W alloy.

Figure 6:
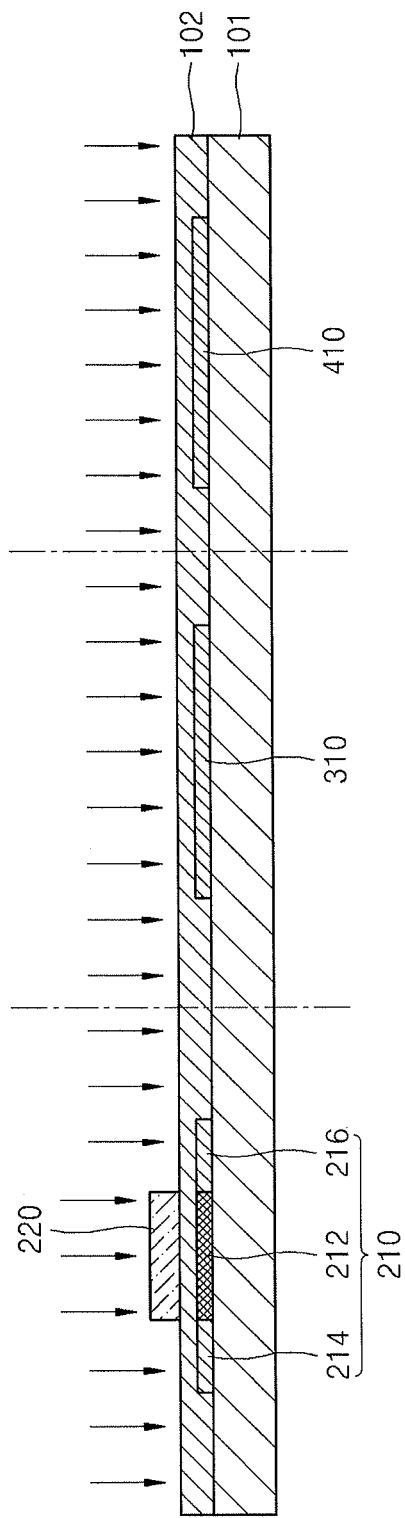

Referring to FIG. 6, the intermediate layer 201 of the active layer, the intermediate layer 202 of the first gate electrode, and the intermediate layer 203 of the first electrode are doped with impurities to form the active layer 210, the first gate electrode 310, and the first electrode 410, respectively. The impurities may be, for example, P-type impurities such as B or N-type impurities such as P.

When doping the impurities, the active layer 210 uses the second gate electrode 220 as a self-align mask. The active layer 210 may therefore include the channel region 212 at a location which overlaps the second gate electrode 220. The source region 214 and the drain region 216 are located at opposite sides of the channel region 212 and are doped with impurities.

The first gate electrode 310 and the first electrode 410 may be or include, for example, polycrystalline silicon layers doped with impurities. Because the first gate electrode 310 and the first electrode 410 are formed simultaneously with the active layer 210, the number of masks that are used is less than that of a case in which the first gate electrode 310 and the first electrode 410 are formed of metal. Accordingly, the manufacturing method may be simplified.

Figure 7:
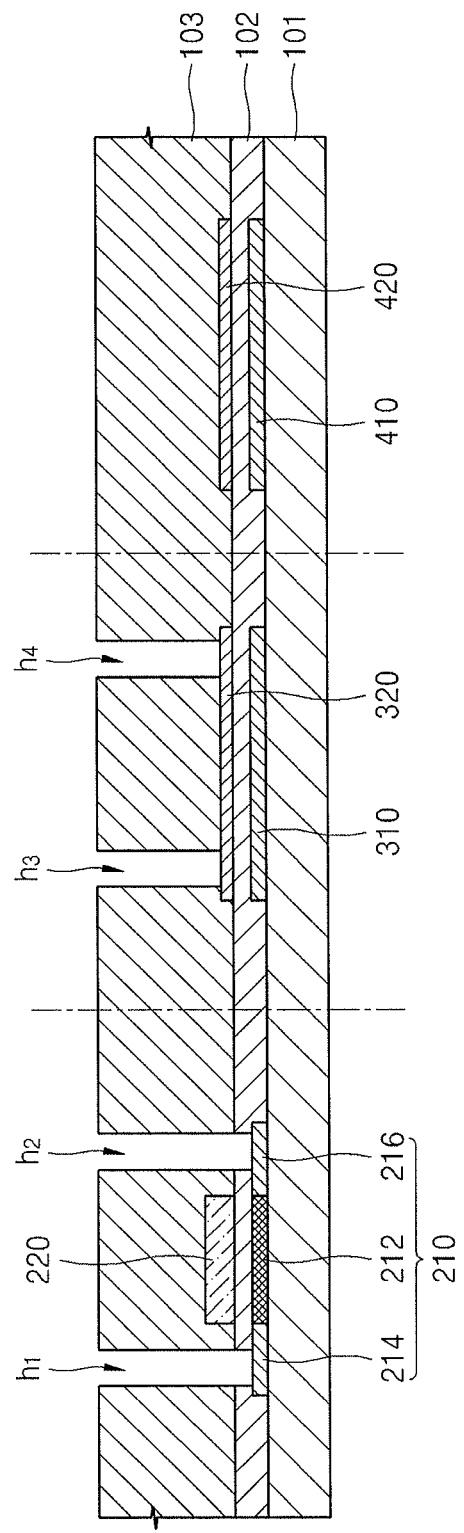

Referring to FIG. 7, the oxide semiconductor layer 320 is formed on the first insulating layer 102, and the second insulating layer 103 is formed on the oxide semiconductor layer 320 and the second gate electrode 220. When forming the oxide semiconductor layer 320, the second electrode 420 may be formed on the first electrode 410 using the same material as that of the oxide semiconductor layer 320.

The oxide semiconductor layer 320 is located on the first gate electrode 310, and may include one or more of Ga, In, Zn, and Sn, and O. Because the oxide semiconductor layer 320 is formed after the doping process of impurities in FIG. 6, the oxide semiconductor layer 320 is not doped with impurities. Thus, a change in the characteristics of the first transistor (TR1 of FIG. 2) while doping the impurities on the oxide semiconductor layer 320 may be prevented. As a result, degradation in reliability of the first transistor (TR1 of FIG. 2) may be reduced or prevented.

Also, as described above, because the active layer of the first transistor (TR1 of FIG. 2), which serves as a switching transistor, is formed as the oxide semiconductor layer 320, leakage current from the first transistor (TR1 of FIG. 2) may be reduced and a size reduction of the capacitor (C1 of FIG. 2) may be realized.

The second insulating layer 103 may be formed to include one or more organic insulating materials, e.g., polyimide, polyamide, acryl resin, benzocyclobutene, and/or phenol resin. The second insulating layer 103 may be formed, for example, using a spin coating method. Also, the second insulating layer 103 may be formed of an inorganic insulating material, e.g., $SiO_2$, $SiN_x$, $Al_2O_3$, $CuO_x$, $Tb_4O_7$, $Y_2O_3$, $Nb_2O_5$, and/or $Pr_2O_3$.

In another embodiment, the second insulating layer 103 may be formed to have a multi-layered structure, in which organic insulating materials and inorganic insulating materials are alternately stacked.

The second insulating layer 103 may operate as a planarization layer on which the cathode electrode of the OLED (see FIG. 2) will be formed, or as a passivation layer for protecting the oxide semiconductor layer 320 and the second gate electrode 220.

After the second insulating layer 103 is formed, the first insulating layer 102 and the second insulating layer 103 are patterned to form a first via hole h1 and a second via hole h2 that respectively expose the source region 214 and the drain region 216. Also, the second insulating layer 103 is patterned to form a third via hole h3 and a fourth via hole h4 that expose the oxide semiconductor layer 320.

Figure 8:
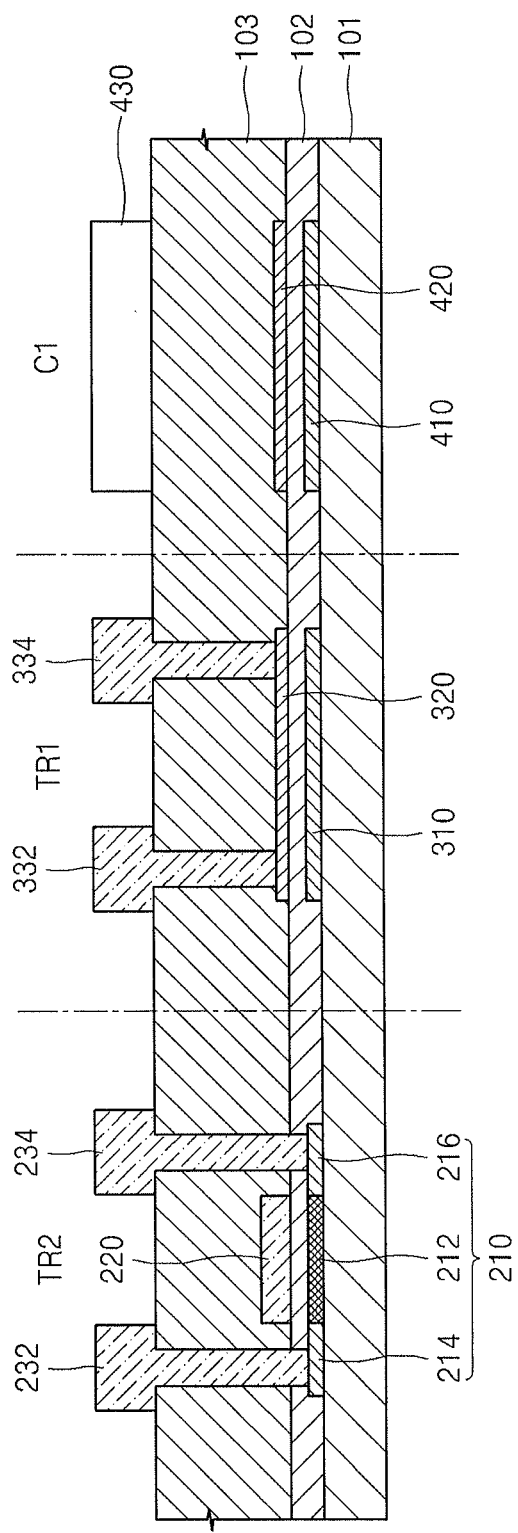

Referring to FIG. 8, the first source electrode 332 and the first drain electrode 334 are formed to penetrate through the second insulating layer 103 for connection to the oxide semiconductor layer 320. The first source electrode 332 and the first drain electrode 334 are filled in the third via hole h3 and the fourth via hole h4, respectively, to establish connection to the oxide semiconductor layer 320.

In addition, the second source electrode 232 and the second drain electrode 234 are formed to penetrate through the first insulating layer 102 and the second insulating layer 103 for connection to the source region 214 and the drain region 216, respectively. The second source electrode 232 and the second drain electrode 234 are respectively filled in the first via hole h1 and the second via hole h2, and are connected to the source region 214 and the drain region 216.

The third electrode 430 is formed on the second insulating layer 103 to overlap the second electrode 420.

By way of summation and review, in accordance with one or more of the aforementioned embodiments, a pixel circuit has a first transistor TR1 which serves as a switching transistor. The first transistor TR1 is formed to include the oxide semiconductor layer 320 to reduce the leakage current. Accordingly, the size of the capacitor C1 may be reduced. In addition, because the oxide semiconductor layer 320 is not doped with impurities, degradation in the characteristics and reliability of the first transistor TR1, that otherwise would be attributable to the doping of impurities, may be prevented.

Also, the second transistor TR2 (e.g., the driving transistor) of the pixel circuit is formed to include the polycrystalline silicon layer doped with impurities in order to achieve excellent electron mobility. As a result, the size of the second transistor TR2 may be reduced.

Thus, according to one or more of the above embodiments, the polycrystalline silicon layer having excellent electron mobility and the oxide semiconductor layer having reduced leakage current may be used as active layers of the transistors.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. An organic light emitting display, comprising:
a substrate;
an organic light emitting device on the substrate; and
a pixel circuit to supply current to the organic light emitting device,
wherein the pixel circuit includes a switching transistor, a driving transistor, and a capacitor on the substrate, the switching transistor including a first insulating layer between a first gate electrode and a first oxide semiconductor layer, the driving transistor including a second gate electrode on an active layer, the first insulating layer between the active layer and the second gate electrode, and the capacitor includes a first electrode on the substrate and a second electrode on the first electrode, wherein the first insulating layer is between the first electrode and the second electrode.

2. The display as claimed in claim 1, wherein the first oxide semiconductor layer includes one or more of gallium, indium, zinc, hafnium, or tin, and oxygen.

3. The display as claimed in claim 1, wherein the first gate electrode includes a first polycrystalline silicon layer doped with impurities.

4. The display as claimed in claim 3, wherein the active layer includes a source region and a drain region on respective sides of a channel region, the source and drain regions doped with impurities.

5. The display as claimed in claim 4, further comprising:
a second insulating layer on the first oxide semiconductor layer and the second gate electrode, wherein the switching transistor includes a first source electrode and a first drain electrode that connect to the first oxide semiconductor layer through the second insulating layer.

6. The display as claimed in claim 5, wherein the driving transistor includes a second source electrode and a second drain electrode respectively connected to the source region and the drain region through the first insulating layer and the second insulating layer.

7. The display as claimed in claim 1, wherein:
the first electrode includes a polycrystalline silicon layer doped with impurities, and the second electrode includes a second oxide semiconductor layer.

8. The display as claimed in claim 1, wherein the capacitor includes:
a third electrode on the second electrode,
wherein the second insulating layer is between the second electrode and the third electrode.

9. The display as claimed in claim 1, wherein the organic light emitting device includes an organic emission layer between an anode electrode and a cathode electrode.

* * * * *